United States Patent [19]

Stambaugh et al.

[11] Patent Number: 4,970,454
[45] Date of Patent: Nov. 13, 1990

[54] PACKAGED SEMICONDUCTOR DEVICE WITH TEST CIRCUITS FOR DETERMINING FABRICATION PARAMETERS

[75] Inventors: Mark A. Stambaugh, Missouri City; William H. Brodhead, Sugarland, both of Tex.

[73] Assignee: Texas Instruments Incorporated, Dallas, Tex.

[21] Appl. No.: 494,825

[22] Filed: Mar. 15, 1990

Related U.S. Application Data

[63] Continuation of Ser. No. 939,670, Dec. 9, 1986, abandoned.

[51] Int. Cl.$^5$ ............................................. G01R 31/28
[52] U.S. Cl. .............................. 324/73.1; 324/158 R; 324/158 T
[58] Field of Search ............... 324/73.1, 158 R, 158 T; 371/15.1, 22.1, 22.6; 437/8

[56] References Cited

U.S. PATENT DOCUMENTS

| | | | |
|---|---|---|---|
| 4,286,173 | 8/1981 | Oka et al. | 324/73 R |
| 4,336,495 | 6/1982 | Hapke | 324/73 R |
| 4,339,710 | 7/1982 | Hapke | 324/73 R |
| 4,398,146 | 8/1983 | Draheim et al. | 324/73 R |
| 4,450,402 | 5/1984 | Owen, III | 324/73 R |
| 4,550,289 | 10/1985 | Kabashima et al. | 324/158 R |
| 4,612,499 | 9/1986 | Andresen et al. | 324/73 R |
| 4,698,588 | 10/1987 | Hwang et al. | 324/73 R |
| 4,706,157 | 11/1987 | Shimazu | 324/73 R |
| 4,733,168 | 3/1988 | Blankenship et al. | 324/73 R |
| 4,743,841 | 5/1988 | Takeuchi | 324/158 R |
| 4,764,924 | 8/1988 | Mate | 324/73 R |

Primary Examiner—Ernest F. Karlsen
Attorney, Agent, or Firm—Ronald O. Neerings; Thomas W. Demond; Melvin Sharp

[57] ABSTRACT

A test circuit (40) fabricated in an integrated circuit and connected to an I/O pin (36) of the packaged device (32) for providing information indicative of substrate process parameters. The test circuit (40) comprises a test transistor (24) connected to a pin (36) of the packaged device (32), and an isolation circuit (52) responsive to a signal on an input test terminal (48) for activating the test transistor (24). The isolation circuit (52) is responsive to the absence of the test signal for isolating the test transistor (24) from the pin (36), and thus isolating it from other functional circuitry (54) of the integrated circuit which is also connected to the pin (36).

17 Claims, 3 Drawing Sheets

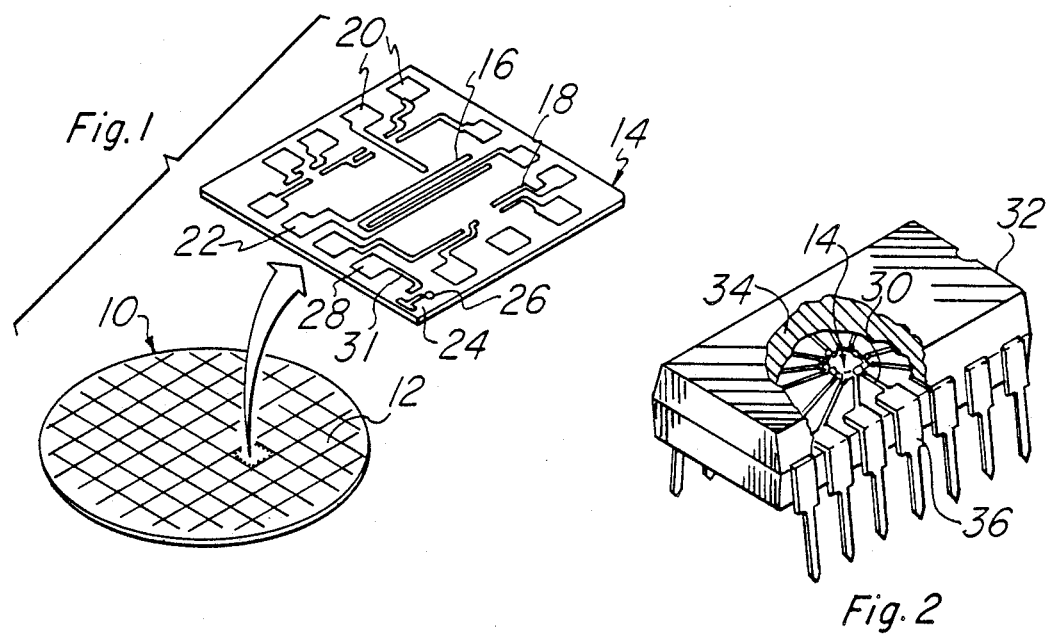
Fig. 1
Fig. 2
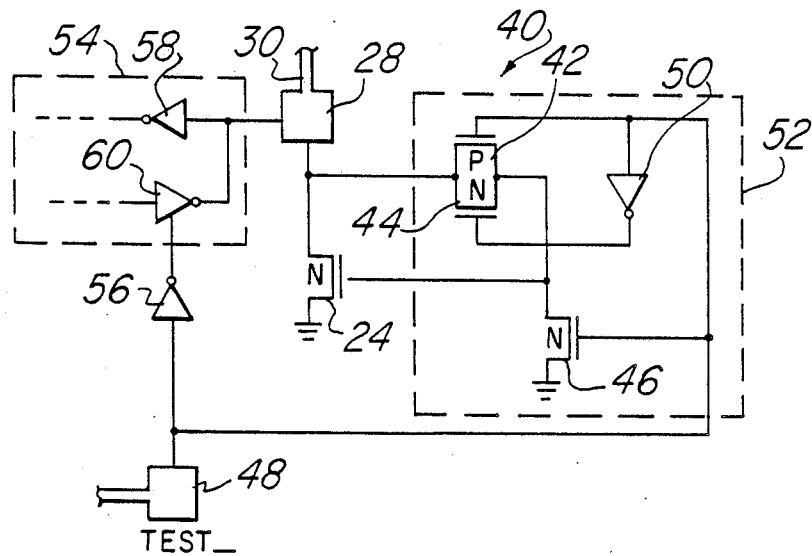
Fig. 3

PACKAGED SEMICONDUCTOR DEVICE WITH TEST CIRCUITS FOR DETERMINING FABRICATION PARAMETERS

This application is a continuation of application Ser. No. 06/939,670, filed 12/09/86, now abandoned.

TECHNICAL FIELD OF THE INVENTION

The present invention relates in general to semiconductors, and more particularly to packaged solid state devices and associated circuits for determining fabrication parameters.

BACKGROUND OF THE INVENTION

Because of the complicated and highly refined nature of semiconductors fabrication processes, it is imperative that various parameters be carefully controlled to insure that the completed device complies with all technical specifications. To that end, post-fabrication testing on selected bar or die parts of a silicon wafer or slice is routinely conducted to ascertain that various circuit parameters meet both published specifications and process specifications. Generally, various dies of a silicon wafer include test transistors fabricated by the same process as the functional circuits on the dies of the silicon wafer. During testing, a test fixture makes electrical contact directly to the test transistors and applies voltages thereto to determine characteristics, such as the threshold voltage $V_t$ and the conductance $K'$ of the test transistors. The values of these characteristics are indications of fabrication process parameters.

Another approach taken to ascertain fabrication parameters is to design a test circuit, or transistor, into every die on the wafer. The test circuit is wholly independent of the functional circuit on the die, and is accessible by test equipment only through microcontacts on the die. Testing of the test circuit can only be accomplished before the die is encapsulated into a package, such as a dual in-line package. The test circuit is not connected to the input/output pins of the packaged device and thus cannot be accessed from such pins.

The post-packaging examination of integrated circuits is an important aid in gathering information relating to process parameters. For example, when integrated circuits are returned to the manufacturer, process parameters derived from the testing of the test circuit may be correlated to the mode of failure. However, in order to gain access to the test circuit, the encapsulation or package of the integrated circuit must be removed in order to gain access to the test circuit microcontacts. The removal of the encapsulant must be carefully done so that the integrated circuit itself is not damaged, and valuable information thereby lost.

From the foregoing, it may be seen that a need has arisen for a packaged integrated circuit in which the test circuitry can be accessed from the Input/Output (I/O) pins of the device, without the presence of the test circuitry affecting the normal operation of the device.

SUMMARY OF THE INVENTION

In accordance with the invention, a method and apparatus are provided for accessing the test circuitry of a packaged integrated circuit through the I/O pins of the packaged device.

More specifically, a test transistor, which has undergone the same fabrication process as the functional circuitry on the integrated circuit, is connected directly to an I/O pin of the packaged integrated circuit. During the normal operation of the functional circuitry, the test transistor is disabled and thus does not affect the electrical signals passing through the respective I/O pin to the functional circuitry. Isolation circuitry is connected to the test transistor, and is responsive to a special test mode, for deactivating the functional circuitry connected to that pin, and for activating the test transistor. The functional circuitry can be deactivated by placing it in a high impedance state. In the test mode, electrical tests and measurements may be conducted on the test transistor through the I/O pin of the package.

The functional circuitry of the integrated circuit may be disabled, and the test mode invoked, by applying a pattern of signals not normally encountered during normal use. Thus, the pattern is uniquely associated with the test mode. Alternatively, if the test transistor is connected to an input pin of the packaged integrated circuit, no special provisions need to be made to disable the functional circuitry, as the inputs of logic gates comprising the functional circuitry are generally high impedance. The functional circuitry does not thereby interfere with the testing of the test transistor.

Various embodiments of the invention are disclosed in which the test circuit is employed to ascertain parameters or characteristics of CMOS integrated circuits. Similarly, PMOS and NMOS test circuits are disclosed for use where the fabricated circuit is respectively a PMOS and NMOS structure. Moreover, a depletion-type test transistor and test resistor circuit are disclosed.

BRIEF DESCRIPTION OF THE DRAWINGS

Further objects and features of the present invention will become apparent from the description of several embodiments thereof, taken in conjunction with the accompanying drawings in which:

FIG. 1 is a perspective view of a silicon wafer with a plurality of dies, one such die shown removed and greatly enlarged;

FIG. 2 is a perspective view of a dual-in-line integrated circuit package, with a section thereof removed to show the integrated circuit die mounted therein;

FIG. 3 is an electrical schematic drawing of a CMOS test circuit including an N-channel test transistor shown connected to an I/O pin, along with a portion of the functional circuitry;

DETAILED DESCRIPTION OF THE PREFERRED EMBODIMENTS

Figure 4:
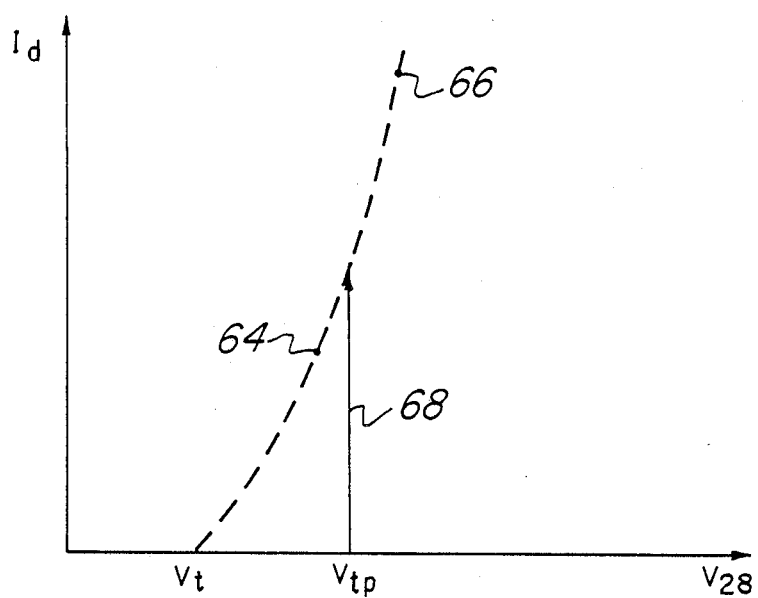
FIG. 4 is a graphical illustration of the electrical characteristics of the CMOS test circuit of FIG. 3.

Although the present invention has broad applications, it will be described in connection with various specific embodiments. Accordingly, FIG. 1 depicts a wafer or slice 10 comprising many individual integrated circuits on square dies or bars 12. Two inch, four inch and six inch diameter wafers are commonly employed in the fabrication of integrated circuits. A four inch diameter wafer may, for example, include as many as three thousand dies. One integrated circuit die 14 is shown enlarged and removed from the wafer 10.

The circuit die 14 includes conventional functional circuitry 16, such as analog amplifiers, digital logic gates, or other circuits commonly fabricated by integrated circuit techniques. The functional circuitry 16 is interconnected by a network of metallic conductive paths 18, whereby an overall function of the circuit 16 can be realized.

Electrical power and ground connections are made to the functional circuitry 16 by bond pads 20. Similarly, the electrical input and output signals of the functional circuitry 16 are transferred from the circuit die 14 by other bond pads 22. A test transistor 24 is fabricated into the circuit die 14 during the fabrication process of the functional circuitry 16. In this manner, the characteristics of the test transistor 24 are indicative of the parameters of the various processes by which the functional circuit 16 was formed.

Using well known techniques, electrical tests can be conducted on the functional circuitry 16 while the circuit die 14 remains uncut from the wafer 10. Contact is made to bond pads 20 and 22 by way of test probes (not shown), which in turn are connected to external voltage supplies, meters, data drivers and data receivers; such voltage supplies, meters, drivers and receivers are often contained in programmable automatic test equipment. Similarly, the characteristics of test transistor 24 may be measured by way of test probes placed in contact with pads 26, energizing test transistor 24 as desired and measuring its response. Pads 26 are dedicated to the energizing and measurement of the characteristics of test transistor 24, and are not connected to functional circuitry 16.

With reference to FIG. 2, where like numerals are used for like and corresponding parts, the circuit die 14 is shown mounted in a dual-in-line package (DIP) 32. Many other packaging schemes are utilized for the packaging of integrated circuits, the DIP 32 of FIG. 2 being only an example. The circuit die 14 is protected from the environment by a plastic or ceramic encapsulant 34 which renders the die 14 inaccessible, except by the DIP I/O pins 36. Each I/O pin 36 of the DIP 32 is connected by a bonding path or wire 30 to one of the circuit die bond pads 28. While the parameters of test transistor 24 are valuable in the evaluation of process for fabricating wafer 10, as discussed above, once the circuit die 14 is mounted and packaged, such as in a dual in-line package (DIP), access to the packaged test transistor pads 26 become impossible unless dedicated pins are made available for such access. However, the number of pins 36 of the package for circuit die 14 are preferably minimized, so that the space required for the utilization of the circuit in end equipment is also minimized. The ultimate user of circuit die 14, after packaging, is generally unwilling to trade the extra space required for the additional dedicated pins in exchange for the processing information available from the testing of test transistor 24.

In accordance with an important feature of the invention, the test transistor 24 is connected to a bond pad 28 by conductor 31. Bond pad 28, in addition to providing connection to test transistor 24, is also utilized in the normal operation of the functional circuitry 16. Such dual utilization of bond pad 28 requires isolation means so that test transistor 24 is electrically isolated from bond pad 28 when the parameter tests of transistor 24 are not being conducted. Furthermore, it is preferable that the functional circuitry 16 be isolated from bond pad 28 during such time as the test transistor 24 is being accessed and its parameters are measured. This arrangement provides the important advantage that access to test transistor 24 can be made after packaging of circuit die 14, without the requirement of a dedicated pin or pins to do so.

FIG. 3 illustrates a CMOS test circuit 40 constructed according to the principles and concepts of the invention. The test circuit 40 includes an N-channel test transistor 24 connected between the circuit die bond pad 28 and circuit ground. The drain of test transistor 24 is also connected to the drain of a P-channel transistor 42 and the drain of an N-channel transistor 44. The sources of transistors 42 and 44 are connected together and to the drain of an N-channel transistor 46. The source of transistor 46 is connected to circuit ground. The drain of transistor 46 is also connected to the gate of transistor 24. An input test mode signal is coupled to a Test_ bond pad 48 (the "_" designation indicates that the signal is active in its low logic state). The Test_ bond pad 48 is connected directly to the gates of transistors 42 and 46, and through an inverter 50 to the gate of transistor 44. The circuit within the dashed lines comprises an isolation circuit 52 operative to isolate the test transistor 24 from the bond pad 28. In the example, a functional circuit 54 is shown in dashed lines. Furthermore, the functional circuit includes a buffer inverter 58 for receiving an input signal at bond pad 28, and a driver 60 for driving bond pad 28, said driver 60 having an high impedance state control terminal. Responsive to a positive logic state at said high impedance state control terminal, the output of driver 60 is placed in a high impedance condition. The output of the buffer driver 60 is shown connected to the input of buffer inverter 58, as well as to the bond pad 28. An inverter 56 is connected between the Test_ bond pad 48 and the high impedance control input of the driver 60.

The test circuit 40 thus comprises a single transistor 24 whose parameters can be ascertained by accessing the bond pad 28, as well as circuitry 52 for isolating the test transistor 24 from the functional circuitry 54. The operation of circuitry 52 in so isolating test transistor 24 allows the functional circuitry to operate in the same manner with the same performance regardless of the presence of test transistor 24. Therefore, the isolating circuit 52 is provided and is responsive to a test signal applied to Test_ bond pad 48, for isolating the test transistor 24 from the functional circuitry 54 during normal operation of the integrated circuit.

During normal operation of the functional circuitry 54, electrical signals are input through the interconnection path 30 to the bond pad 28. In addition, and to be described in more detail below, during normal operation, a logic high level is applied to Test_ bond pad 48, thereby placing test transistor 24 in a nonconductive state. Thus, the electrical logic signals associated with inverter 58 or driver 60 are not affected by the presence of the test circuit 40.

In those instances where a Test_ bond pad, such as 48, and associated DIP pin can be dedicated to the input of a Test_ signal, the circuit arrangement of FIG. 3 can be employed to couple a Test_ signal to the integrated circuit die 14. Specifically, the Test_ signal can be connected to the dedicated bond pad 48, and distributed within the circuit die as needed.

The test circuit 40 operates as follows. During the normal operation of the functional circuit, a logic high test signal is applied to Test— bond pad 48. This logic high turns on transistor 46 which, in turn, applies a logic low state to the gate of test transistor 24, turning it off. In addition, the Test— signal logic high turns off transistor 42 as it is a P-channel transistor. Furthermore, the Test— signal logic high turns off N-channel transistor 44, as the complement of the Test— signal (logic low) is applied to the gate of transistor 44. Thus, when the Test— signal is high, both transistors 42 and 44 are off, transistor 46 is on, and therefore the gate voltage of test transistor 24 cannot reach the turn-on threshold voltage. With these logic levels applied to the isolation circuit 52, it is assured that test transistor 24 is turned off. As a result of the foregoing, the test circuit 40 is isolated from inverter 58 and driver 60.

When it is desired to invoke the test mode of the packaged device 32, the signal applied to Test— bond pad 48 is driven to a logic low level. With regard to the isolation circuit 52 of FIG. 3, the logic low Test— signal enables conduction of P-channel transistor 42 and N-channel transistor 46. An analog test voltage is then applied to the bond pad 28 via I/O pin 36. With the use of an N-channel transistor 44, the gate of test transistor 24 tracks the voltage at bond pad 28, even at low voltages. But, when the analog test voltage on bond pad 28 rises to within the threshold voltage $V_t$ of transistor 44 of the output of inverter 50 (at $V_{cc}$ with Test— signal at its low state), N-channel transistor 44 will turn off. However, before transistor 44 turns off, and as the analog test voltage on the bond pad 28 continues to rise, the voltage differential between the voltage of bond pad 28 and the low state of the Test— signal will have exceeded the threshold voltage $V_t$ of P-channel transistor 42, turning transistor 42 on. This action maintains the voltage at the gate of test transistor 24 equal to the voltage at bond pad 28 throughout the transition of the analog test voltage. Stated another way, on the rising analog test voltage applied at the bond pad 28 with Test— signal in its low state, transistor 44 is first on with Test— signal at low voltage, and turns off as the voltage at bond pad 28 comes within a $V_t$ of $V_{cc}$. However, while transistor 42 is off with the voltage at bond pad 28 low, transistor 42 will turn on at a voltage lower than the voltage at which transistor 44 turns off. As a result, throughout the total swing of the voltage at bond pad 28, either or both of transistors 42 and 44 are on, so that the analog test voltage at bond pad 28 is continuously applied to the gate of the test transistor 24.

It is noteworthy that when the packaged circuit is placed in a test mode by the low state of the Test— signal, the output driver 60 of the functional circuitry is placed in a high impedance state via inverter 56. Thus, the functional circuitry does not interfere with tests to be conducted on the test circuit 40. Also, because inverter 58 of the functional circuitry has a high impedance input, the load presented by the input of inverter 58 does not interfere with the test of test transistor 24.

A range of voltage can then be applied to the test transistor 24 via the I/O pin 36 to determine various transistor characteristics indicative of the fabrication process. These characteristics can include the threshold voltage ($V_t$) of the test transistor 24, as well as its conductance ($K'$). In the forward conduction region where the drain-to-source voltage equals the gate-to-source voltage, the drain current through the transistor behaves according to the following equation:

$$I_d = K'(W/L)(V_{gs} - V_t)^2$$

The term $V_{gs}$ is the gate-source voltage across test transistor 24, and W/L represents the channel width-to-length ratio of such transistor, a value which is known from the layout of test transistor 24. By measuring the drain current $I_d$ at two values of gate-to-source voltage $V_{gs}$, a set of two equations having two unknowns allows solution of the threshold voltage and conductance for test transistor 24. The ability to determine the values of parameters $V_t$ and $K'$ on the actual circuit die 14 through its I/O pins 36 not only provides valuable information concerning the fabrication process of circuit die 14 without destruction of its package, but also allows this information to be gathered on each device produced, rather than merely on small samples of the devices. Accordingly, greater visibility into the effect of variations in the fabrication process on the functional performance and yield is obtainable by means of the invention described herein.

FIG. 4 is a graphical representation of the electrical characteristics of test circuit 40, responsive to a typical analog test voltage $V_{28}$ applied to bond pad 28 via I/O pin 36. Points 64 and 66 represent two measurements of current through test transistor 24 responsive to two values of test voltages applied to bond pad 28. These measured current values are substituted into the above equation for the term "$I_d$". The measurement of two points are sufficient to determine the value of the parameters $K'$ and $V_t$, W/L being known. Of course, valid calculation of these two parameters requires that the voltage of the gate of test transistor 24 accurately track the voltage at bond pad 28, independent of its magnitude. Therefore, in accordance with the invention, P-channel transistor 42, N-channel transistor 44, and inverter 50 are provided to maintain connection between the gate of transistor 24 and bond pad 28, throughout the desired range of applied analog test voltages.

N-channel transistor 44 and the associated inverter 50 allows the the gate of test transistor 24 to track the voltage at bond pad 28, during such time as its magnitude is in the lower end of the test range. Referring to FIG. 4, the portion of the curve marked 68 is illustrative of what the response of test circuit 40 would be if N-channel transistor 44 were not present in the circuit, in the case where voltage $V_{28}$ is incremented in the direction from zero to $V_{cc}$. If only P-channel transistor 42 were used to control the connection of the gate of transistor 24 to bond pad 28, such connection would only occur after test voltage $V_{28}$ on bond pad 28 rose to a value greater than the value of threshold voltage of transistor 42 ($V_{tp}$ of FIG. 4), since the gate of transistor 42 is at approximately zero volts (Test— signal being in its low state). This aspect is shown in FIG. 4 by heavy solid line 68. Prior to voltage $V_{28}$ reaching the value $V_{tp}$, the voltage of the gate of transistor 24 is isolated, transistor 46 being off, making the gate-to-source voltage of transistor 24 indeterminate. However, presuming that Test— signal had recently made its high-to-low transition, the gate of transistor 24 would have been recently discharged through transistor 46, causing the measured characteristic to be similar to that of line 68 in FIG. 4, where no current would be conducted by transistor 24, until voltage $V_{28}$ exceeded the value of threshold voltage $V_{tp}$.

It is important that the test transistor 24 begin conducting with small test voltages applied to the pad 28. This is apparent, as in practical applications the voltages at which current measurements are taken on the test transistor 24 may be taken below the voltage $V_{tp}$ indicated in FIG. 4. With the present invention, however, that concern has been circumvented by the provision of transistor 44 and inverter 50.

Similarly, at the high end of the range for voltage $V_{28}$, the provision of P-channel transistor 42 allows the gate of transistor 24 to be connected to bond pad 28, regardless of the condition of N-channel transistor 44. If the voltage $V_{28}$ of bond pad 28 reached a value, relative to $V_{cc}$, within the threshold voltage of transistor 44, transistor 44 would be cut off, since the gate voltage of transistor 44 is at approximately $V_{cc}$, sourced by the output of inverter 50. However, even if N-channel transistor 44 is turned off because of its gate-to-source voltage dropping below its threshold voltage, the gate-to-source voltage of P-channel transistor 42 still exceeds its threshold voltage, in turn ensuring that the gate of transistor 24 remains electrically connected to bond pad 28.

While the circuit of FIG. 3 has been discussed with the example of $V_{28}$ going from the low end of its range to its high end, for measurement of the desired transistor parameters, it should be apparent that circuitry 52 of FIG. 3 is equally effective, and the measurments equally valid, if said measurements were made with voltage $V_{28}$ at bond pad 28 beginning at its high value and changing toward zero. The presence of both P-channel transistor 42 and N-channel transistor 44 allows the measurements to be independent of the direction of change of voltage $V_{28}$.

As noted above, depending on the number of unused DIP pins on a packaged circuit, an input Test_ signal can be connected from Test_ bond Pad 48 directly to an unused I/O pin. In the event that the packaged device has no spare I/O pins, the arrangement shown in FIG. 5 can be used.

Figure 5:
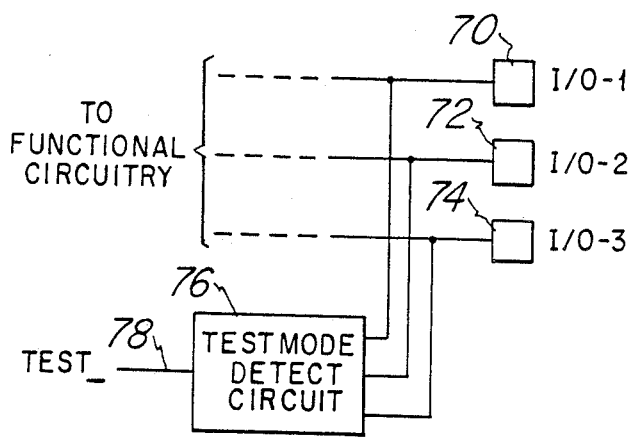
FIG. 5 is a simplified electrical drawing of a circuit for establishing a test mode.

FIG. 5 illustrates I/O pins I/O-1 through I/O-3 used for carrying digital signals to the functional circuitry of the integrated circuit where the packaged device has no spare pin 36 such as that connected to bonding pad 48 of FIG. 3. Each I/O pin I/O-1 through I/O-3 is connected to a respective bond pad 70, 72, and 74, corresponding to bond pads 22 of FIG. 5, of the circuit die. Aside from the I/O pins I/O-1 through I/O-3 being used for normal input signals, such bond pads 70, 72 and 74 are also connected to a logic circuit 76 which is adapted to detect a unique pattern of digital signals on I/O pins I/O-1 through I/O-3. The pattern of signals detected by circuit 76 is a pattern which is not used or recognized by the functional circuitry. Of course, any number of I/O pins may be selected in order to assure that there exists a unique pattern of signals not used by the functional circuitry.

The test mode detect circuit 76 may comprise combinational circuitry which is responsive to the steady state logic levels on I/O pins I/O-1 through I/O-3 to produce a logic low Test_ signal on the output terminal 78 which would be connected to circuit 3 at the point where bonding pad 48 would be deleted. In the alternative, the test mode detect circuit 76 may include flip-flops, or the like, which are responsive to a predetermined pattern received by I/O pins I/O-1 through I/O-3 to put the device in test mode. Test mode detect circuit 76 would also be responsive to generate a logic high level for the Test_ signal at output 78, responsive to patterns received by I/O pins I/O-1 through I/O-3 other than the predetermined pattern for putting the device into test mode. The arrangement of logic circuits in the test mode detect circuit 76 is well within the skill of those skilled in the art. Terminal 78 may be connected through an ivenrter to the terminals 90, 100 and 120 labeled "TEST" in FIGS. 6, 7 and 9 and may be connected directly to the terminal 112 labeled "TEST_" in FIG. 8.

Figure 6:
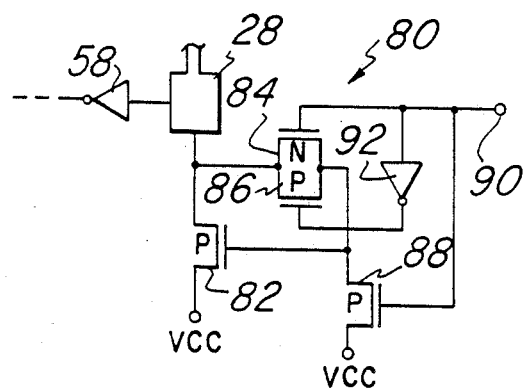
FIG. 6 is an electrical schematic drawing similar to that of FIG. 3, but illustrating a P-channel test transistor for use in a CMOS integrated circuit.

In FIG. 6 there is shown another embodiment of a test circuit used in a CMOS circuit. The test circuit 80 includes P-channel test transistor 82. Specifically, P-channel transistor 82 has source and drain terminals connected between a supply voltage $V_{cc}$ and the bond pad 28. An N-channel transistor 84 and a P-channel transistor 86 are connected source-to-source and drain-to-drain. The drains of the pair are connected to bond pad 28, while the source terminals thereof are connected to the gate of test transistor 82. The source terminals of transistors 84 and 86 are further connected to the drain of a P-channel transistor 88. The source terminal of transistor 88 is connected to the $V_{cc}$ supply. A terminal 90 to which a Test signal (positive logic, active in its high state) is coupled, is connected to the gate terminals of transistors 84 and 88, and connected through an inverter 92 to the gate of transistor 86. Test circuit 80 is activated by a logic high on terminal 90.

Conversely, relative to the circuit of FIG. 3, when terminal 90 (i.e., Test signal) is at a logic high (the voltage at bond pad 28 being low), N-channel transistor 84 is made conductive and thus effectively connects the drain of test transistor 82 to its gate, and to bond pad 28. This remains the case so long as the voltage at bond pad 28 is more than the value of the threshold voltage of transistor 84 below $V_{cc}$. In order to assure that the gate of test transistor 82 remains connected to bond pad 28 at the high end of the range of the voltage at bond pad 28, P-channel transistor 86 is conductive so long as the voltage at bond pad 28 is more than the threshold voltage of transistor 86 above zero volts (presuming zero volts to be the value of the low logic state output of inverter 92). Therefore, since N-channel transistor 84 is conductive at the low end of the range of the test voltage, since P-channel transistor 86 is conductive at the high end of the range of the test voltage, and since both are conductive in an overlapping region in the middle of the range of the test voltage, the gate of transistor 82 remains electrically connected to bond pad 28 throughout the range of the test voltage. Of course, during the test mode, when the Test signal on terminal 90 is high, transistor 88 is turned off. Again, current measurements on test transistor 82 are made at two or more voltages, and the fabrication parameters are obtained in accordance with the foregoing equation.

The test circuit 80 is isolated from bond pad 28, and thereby from the functional portion of the circuit beyond inverter 58, when the signal on the test terminal 90 is at a logic low level. A logic low applied to the test terminal 90 couples a logic high, by inverter 92, to the gate of P-channel transistor 86. Transistor 86 is thereby placed in a nonconductive state, regardless of the voltage at bond pad 28. Similarly, the application of a logic low by the Test signal to the gate of N-channel transistor 84 renders it nonconductive, througout the operating range of the voltage at bond pad 28 (i.e., from zero volts to $V_{cc}$). Finally, the logic low on terminal 90, and thus on the gate of P-channel transistor 88, places transistor 88 into a conductive state, since the source of transistor 88 is connected to $V_{cc}$. This, in turn, connects the gate of test transistor 82 to $V_{cc}$, making it nonconductive regardless of the value of the voltage at bond pad 28 within its operating range. From FIG. 6 it is seen that a P-channel test transistor is provided in a CMOS circuit, which transistor is isolatable from the functional circuitry.

Figure 7:
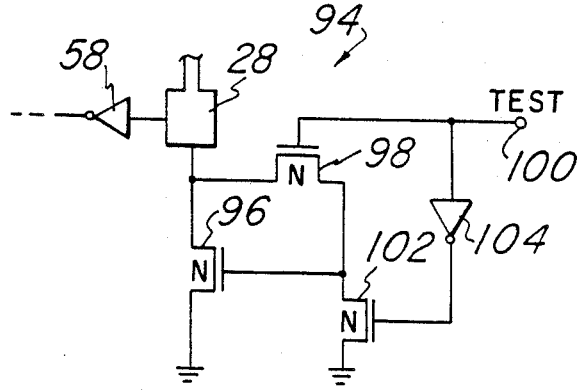
FIG. 7 is an electrical schematic drawing of a test circuit embodied in NMOS circuitry.

The embodiment of the invention shown in FIG. 7 is adapted for determining process parameters in an NMOS circuit. Test circuit 94 includes N-channel test transistor 96 connected between the bond pad 28 and circuit ground. A second N-channel transistor 98 has the drain and source connections thereof connected between the bond pad 28 and the gate of test transistor 96. The gate of transistor 98 is coupled to the Test signal terminal 100. A third N-channel transistor 102 has the drain and source thereof connected between the gate of test transistor 96 and circuit ground. The Test signal applied to terminal 100 is inverted by inverter 104 and applied to the gate of transistor 102.

In NMOS circuit applications, the test circuit 94 is operative in the test mode for connecting the gate of transistor 96 to bond pad 28, and thereby to the drain of transistor 96. In the test mode, the Test signal applied to terminal 100 is at a logic high level, thereby turning on transistor 98, and turning off transistor 102. With this bias arrangement, the gate voltage of test transistor 96 will follow its drain voltage. The test voltage applied to bond pad 28 provides various drain currents for test transistor 96. As described above, the magnitude of these drain currents ($I_d$) provide information relating to the process parameters of the functional circuitry on the die. However, the NMOS circuit of FIG. 7 provides a more limited range of input test voltages at bond pad 28 than the circuit of FIG. 3. This is due to N-channel transistor turning off as the voltage at bond pad 28 exceeds a value greater than $V_{cc}$ less the threshold voltage of transistor 98. Presuming that the measurements required of transistor 96 can be sufficiently made with the voltage at bond pad 28 below this level, the circuit of FIG. 7 will adequately isolate test transistor 96 from bond pad 28, and provide access to transistor 96 in test mode.

Similarly as above, when Test signal at terminal 100 is low, the test circuit 94 is not in the test mode, and the circuitry 94 is isolated from the functional circuitry, by the action of inverter 104 turning on transistor 102. Because transistor 102 grounds the gate of test transistor 96, transistor 96 is made nonconductive, and is therefore electrically isolated from the bond pad 28. Furthermore, the low level at terminal 100, causes transistor 98 to be nonconductive and thus also isolated from the functional circuitry throughout the operating range of the voltage at bond pad 28.

Figure 8:
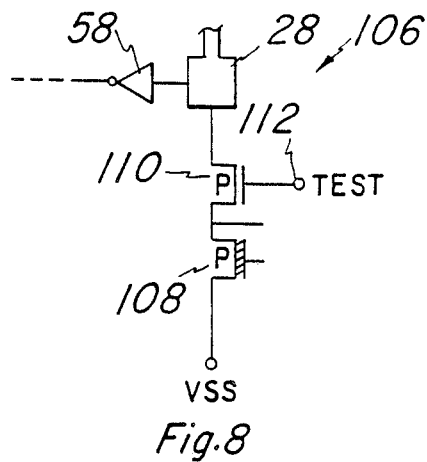
FIG. 8 is an electrical schematic drawing of a test circuit incorporating a P-channel depletion mode transistor as the test device.

FIG. 8 depicts a test circuit 106 for use in testing PMOS circuits which contain both enhancement-mode and depletion-mode P-channel transistors. Test transistor 108 is a P-channel depletion-mode transistor, and switching transistor 110 is a P-channel enhancement mode transistor. Transistors 108 and 110 are fabricated with the same process as other p-channel functional circuitry on the exemplary die; it should also be noted that the enhancement-mode and depletion-mode transistors are likely to be fabricated in the same manner relative to one another, with the exception that the threshold voltages are adjusted by ion implantation or other techniques to distinguish the depletion-mode and enhancement-mode transistors from one another. The drain of test transistor 108 is connected to a reference supply $V_{ss}$, and the gate and the source of test transistor 108 are connected together. The source-to-drain path of P-channel enhancement-mode switching transistor 110 is connected between the gate and source of test transistor 108 and bond pad 28, while the gate of transistor 110 is connected to terminal 112 to receive the Test_signal. In the fabrication process of transistor 110, the width of the channel thereof is made sufficiently large such that its transconductance is high relative to the transconductance of test transistor 108, thereby providing a low resistance between the test transistor 108 and the bond pad 28 when the source-to-drain path of transistor 110 is made conductive.

Since a depletion-mode transistor having its gate and source connected together can operate in its triode region, and can remain conductive with its source voltage equal to its gate (and drain) voltage, such transistors are often used as load devices in logic circuits. Accordingly, resistance measurements of the test transistor 108 are made to determine the resistance characteristics of the depletion load devices comprising the functional circuitry. Once the channel resistance of the depletion device is determined, the power consumption parameters and circuit operating characteristics of the die can be readily determined.

In operation, when the Test_signal (negative logic) applied to the input terminal 112 is at a logic low, transistor switch 110 is forced into conduction, thus allowing test transistor 108 to be accessed from bond pad 28. A voltage applied to bond pad 28 which, relative to the voltage of the Test_signal (usually $V_{ss}$) at the gate of transistor 110, is greater than the threshold voltage of transistor 110 will cause current to flow through the test transistor 108. To measure the load characteristics of test transistor 108, the voltage of bond pad 28 must remain below the magnitude of the pinchoff voltage of test transistor 108, so that test transistor 108 remains in its triode region. The resistance of test transistor 108 can then be determined by examining the change in magnitude of current over a predetermined range of applied voltages. Because of the size of transistors 110, as discussed above, the source-to-drain resistance of transistor 110 will be insignificant with respect to that of the depletion-type test transistor 108, thereby allowing an accurate resistance measurement. In addition, if the beta ratio of transistors 110 and 108 is the same as the beta ratio of similarly-configured transistors in the functional circuitry of the bar, the voltage drop across transistor 110 will mimic the voltage drop across similar devices in the functional circuitry. Test circuit 106 is taken out of the test mode by a high logic state applied by Test_signal on terminal 112, which causes transistor 110 to be nonconductive, isolating the test transistor 108 from input buffer 58.

Yet other parameters of a circuit die 14 may be determined by the use of such a test circuit. Particularly, the resistivity of physical interconnections in the integrated circuit die 14, such as diffusion areas in the silicon substrate or polysilicon lines, are indicative of the process conditions to which the circuit die 14 was subjected, and have importance in the electrical operation of the functional circuitry. For example, the operating speed of the electrical circuit is generally dependent in part on the resistance provided by its polysilicon interconnections.

Figure 9:
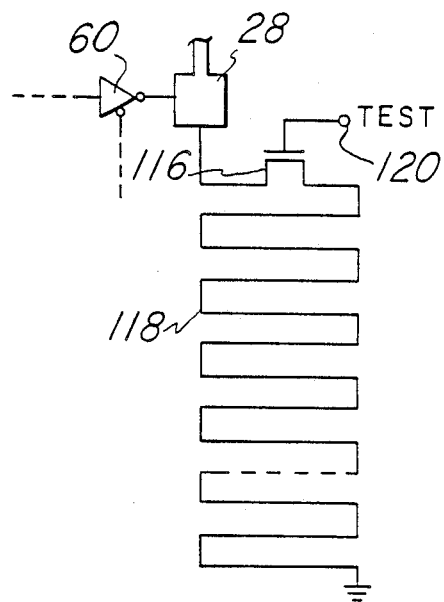
FIG. 9 is a test circuit illustrating a resistive element used in ascertaining a doping level parameter for an integrated circuit.

Referring to FIG. 9, a test circuit 114 is provided for measuring the resistivity of such interconnections. A transistor switch 116 (N-channel, in this example) is connected between the bond pad 28 and a resistance element 118. In the example, one end of the resistance element 118 is grounded. In the test mode, when the Test signal (positive logic) on input terminal 120 renders transistor switch 116 conductive, a voltage can be applied to bond pad 28, and the current through resistance element 118 can be measured. For a given voltage, the magnitude of the current through the resistance element 118 is inversely proportional to its resistance. Again, when the test mode is deactivated, transistor 116 is non-conductive and thus the test circuit 114 is isolated from the bond pad 28.

In practical applications of the test circuit 114, the resistive element 118 is a polysilicon line having a resistance of about 20-30 ohms per square. The polysilicon line itself may be up to 4000 microns in length, thereby yielding a resistance of about 20-30 kilohms.

It is important to note that the principles and concepts of the invention may be applied to circuits which also include electrostatic protective circuits, without damage to such protective circuits. Such circuits will generally include a resistance between bond pad 28 and the gate of the test transistor, and also between bond pad 28 and the drain of the test transistor. However, since no current is drawn to the gate of the test transistor, and since the drain current does not depend upon the drain-to-source voltage in the saturation region, such added resistances will not affect the measured parameters. Moreover, although the invention has been described in terms of MOS circuits, the principles may be applied with equal advantage to bipolar circuits.

It is seen from the foregoing that a test circuit has been provided in a circuit die, which test circuit can be accessed even after the circuit die has been packaged or encapsulated. Moreover, a test mode is provided, together with isolation circuitry, which enables the test circuit to be made operative during the test mode so that parameter tests can be conducted. When the test mode is deactivated and the functional circuitry of the circuit die is again operative, the test circuit is isolated therefrom. The various embodiments of the test circuit are connected directly to the illustrated bonding pads and package pins, and are thus accessible even after encapsulation and packaging of the circuit die.

While the various embodiments of the invention have been disclosed with reference to specific forms, it is to be understood that many changes in the detail may be made as a matter of engineering choice without departing from the scope of the invention as defined by the appended claims.

We claim:

1. A packaged semiconductor device, comprising:
   functional circuitry means, connected to a plurality of terminals, for providing an output responsive to an input signal;
   isolation means, connected to said functional circuitry, for isolating said functional circuitry from one of said plurality of terminals responsive to a test signal received in said semiconductor device; and
   test circuitry means, connected to said one of said plurality of terminals from which said functional circuitry is isolated, for providing measurement of electrical parameters in response to parameter test signals applied to said one of said plurality of terminals when said functional circuitry means is isolated from said one of said plurality of terminals, said test circuitry means including a test transistor having a source-to-drain path connected between said one of said plurality of terminals and a reference supply node.

2. The packaged semiconductor device of claim 1, further comprising:
   test enable means, connected to said test circuitry means, for enabling said test circuitry means from said one of said plurality of terminals responsive to a test signal applied to said semiconductor device.

3. The packaged semiconductor device of claim 2, wherein said one of said plurality of terminals is an output of said functional circuitry means;
   and wherein said isolation means comprises:
   buffer means, having a control input connected to a test terminal and connected between said functional circuitry means and said one of said plurality of terminals, for disconnecting said functional circuitry means from said one of said plurality of terminals responsive to a test signal applied to said test terminal.

4. The packaged semiconductor device of claim 1, wherein said one of said plurality of terminals is an output of said functional circuitry means;
   and wherein said isolation means comprises:
   buffer means, having a control input connected to a test terminal and connected between said functional circuitry means and said one of said plurality of terminals from which said functional circuitry means is to be isolated, for disconnecting said functional circuitry means from said one of said plurality of terminals responsive to a test signal applied to said test terminal.

5. The packaged semiconductor device of claim 1, wherein said test circuitry means comprises:
   a test transistor having its source-to-drain path connected between one of said plurality of terminals and a reference supply node, and having a gate;
   and further comprising:
   test enable means, connected to said gate of said test transistor and to a test terminal, for biasing said gate so that, responsive to a test signal applied to said test terminal, the forward operating characteristics of said test transistor may be measured with a voltage applied between said one of said plurality of terminals and said reference supply node, and so that, responsive to a not-test signal applied to said test terminal, said test transistor is operable as a reverse-biased diode between said one of said plurality of terminals and said reference supply node.

6. The semiconductor device of claim 5, wherein said test enable means connects said gate of said test transistor to said one of said plurality of terminals responsive to said test signal applied to said test terminal;
   and wherein said test enable means connects said gate of said test transistor to said reference supply node responsive to said not-test signal applied to said test terminal.

7. The semiconductor device of claim 6, wherein said test enable means comprises:
   a first transistor having its source-to-drain path connected between said one of said plurality of terminals and said gate of said test transistor, and having its gate connected to said test terminal, so that the source-to-drain path of said first transistor is made non-conductive responsive to said not-test signal applied to said test terminal, and is made conductive responsive to said test signal applied to said test terminal; and a second transistor having its source-to-drain path connected between said gate of said test transistor and said reference supply node, and having its gate connected to said test terminal so that the source-to-drain path of said second transistor is made conductive responsive to said not-test signal applied to said test terminal.

8. The semiconductor device of claim 7, wherein said test enable means further comprises:

a third transistor, of opposite conductivity-type from said first transistor, having its source-to-drain path connected in parallel with the source-to-drain path of said first transistor, and having a gate; and an inverter having its input connected to said test terminal, and having its output connected to the gate of said third transistor.

9. The packaged semiconductor device of claim 7, wherein said one of said plurality of terminals is an output of said functional circuitry means;

and wherein said isolation means comprises:

buffer means, having a control input connected to a test terminal and connected between said functional circuitry means and said one of said plurality of terminals from which said functional circuitry means is to be isolated, for disconnecting said functional circuitry means from said one of said plurality of terminals responsive to a test signal applied to said test terminal.

10. A packaged semiconductor device, comprising:

functional circuitry means, connected to a plurality of terminals, for providing an output responsive to an input signal;

isolation means, connected to said functional circuitry, for isolating said functional circuitry from a first one of said plurality of terminals responsive to a test signal applied to said semiconductor device;

test circuitry means, connected to said first one of said plurality of terminals, for measurement of electrical parameters may in response to parameter test signals applied to said first one of said plurality of terminals when said functional circuitry means is isolated from said first one of said plurality of terminals, said test circuitry means including a test transistor having a source-to-drain path connected between one of said plurality of terminals and a reference supply node; and test enable means, connected to said test circuitry means and to a second one of said plurality of terminals, for enabling said test circuitry means responsive to a test code applied to said second one of said plurality of terminals, and for disabling said test circuitry means responsive to not receiving said test code at said second one of said plurality of terminals.

11. The packaged semiconductor device of claim 10, wherein said test enable means is connected to said test circuitry means and to a group of said plurality of terminals, said group of said plurality of terminals for receiving signals representative of digital numbers;

wherein said test code is a predetermined digital number represented by signals received by said group of said plurality of terminals.

12. The packaged semiconductor device of claim 11, wherein said test circuitry means comprises:

a test transistor having its source-to-drain path connected between one of said plurality of terminals and a reference supply node, and having a gate;

and wherein said test enable means is connected to said gate of said test transistor so that, responsive to receiving said test code, the forward conduction characteristics of said test transistor can be measured by a voltage applied between said one of said plurality of terminals and said reference supply node, and so that, responsive to not receiving said test code, said test transistor is operable as a reverse-biased diode between said one of said plurality of terminals and said reference supply node.

13. The semiconductor device of claim 12, wherein said test enable means connects said gate of said test transistor to said one of said plurality of terminals responsive to receiving said test code;

and wherein said test enable means connects said gate of said test transistor to said reference supply node responsive to not receiving said test code.

14. The semiconductor device of claim 13, wherein said test enable means comprises:

a decoder having its inputs connected to said group of said plurality of terminals, and having an output;

a first transistor having its source-to-drain path connected between said one of said plurality of terminals and said gate of said test transistor, and having its gate connected to the output of said decoder, so that the source-to-drain path of said first transistor is made non-conductive responsive to said decoder not receiving said test code, and is made conductive responsive to said decoder receiving said test code; and a second transistor having its source-to-drain path connected between said gate of said test transistor and said reference supply node, and having its gate connected to the output of said decoder so that the source-to-drain path of said second transistor is made conductive responsive to said decoder not receiving said test code.

15. The semiconductor device of claim 14, wherein said test enable means further comprises:

a third transistor, of opposite conductivity-type from said first transistor, having its source-to-drain path connected in parallel with the source-to-drain path of said first transistor, and having a gate; and an inverter having its input connected to the output of said decoder, and having its output connected to the gate of said third transistor.

16. The packaged semiconductor device of claims 1 or 10 in which said test transistor is an N channel transistor and said reference supply node is a ground node of said semiconductor device.

17. The packaged semiconductor device of claims 1 or 10 in which said test transistor is a P channel transistor and said reference supply node is a Vcc node of said semiconductor device.

* * * * *